US010461210B2

(12) United States Patent
Leduc

(10) Patent No.: US 10,461,210 B2
(45) Date of Patent: Oct. 29, 2019

(54) METHOD FOR MANUFACTURING A DETECTION DEVICE WITH TWO SUBSTRATES AND SUCH A DETECTION DEVICE

(71) Applicant: COMMISSARIAT À L'ÉNERGIE ATOMIQUE ET AUX ÉNERGIES ALTERNATIVES, Paris (FR)

(72) Inventor: Patrick Leduc, Grenoble (FR)

(73) Assignee: COMMISSARIAT À L'ÉNERGIE ATOMIQUE ET AUX ÉNERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/052,279

(22) Filed: Aug. 1, 2018

(65) Prior Publication Data

US 2019/0051787 A1 Feb. 14, 2019

(30) Foreign Application Priority Data

Aug. 8, 2017 (FR) ...................................... 17 57589

(51) Int. Cl.
| | |
|---|---|
| *H01L 31/113* | (2006.01) |
| *G01J 5/04* | (2006.01) |
| *G01J 5/02* | (2006.01) |
| *H01L 21/00* | (2006.01) |

(Continued)

(52) U.S. Cl.
CPC .......... *H01L 31/1136* (2013.01); *G01J 5/024* (2013.01); *G01J 5/0235* (2013.01); *G01J 5/045* (2013.01); *H01L 21/00* (2013.01); *H01L 27/1467* (2013.01); *H01L 31/1868* (2013.01); *H01L 31/1892* (2013.01)

(58) Field of Classification Search
CPC ............ H01L 27/1467; H01L 31/1136; H01L 31/1868; H01L 21/00; G01J 5/045; G01J 5/0235; G01J 5/024
See application file for complete search history.

(56) References Cited

U.S. PATENT DOCUMENTS

| | | |
|---|---|---|
| 2011/0155914 A1 | 6/2011 | Ohhira et al. |
| 2013/0026592 A1 | 1/2013 | Lapadatu et al. |
| 2013/0056733 A1 | 3/2013 | Vogt et al. |

(Continued)

FOREIGN PATENT DOCUMENTS

WO 2014044463 A1 3/2014

OTHER PUBLICATIONS

French Search Report for FR 1757589 dated May 4, 2018.

*Primary Examiner* — Dung A. Le
(74) *Attorney, Agent, or Firm* — Pearne & Gordon LLP

(57) ABSTRACT

A method for manufacturing a device (1) for detecting electromagnetic radiation. The method comprises the steps of: supplying a first substrate (400) comprising a reading circuit (340), at least two first contact plugs (343, 344) and at least one first annular bonding element (345) surrounding the first contact plugs (343, 344); supplying a second substrate comprising a cap (210), an annular side wall forming with the cap (210) a cavity filled with a sacrificial material and a detection structure (100) housed in the cavity. The method further comprising the steps of bonding the second substrate (200) on the first substrate (400); arranging at least one opening (212) in the second substrate (200); selective elimination of the sacrificial material; and closing the opening (212) under at least a primary vacuum.

16 Claims, 6 Drawing Sheets

(51) Int. Cl.
*H01L 27/146* (2006.01)
*H01L 31/18* (2006.01)

(56) References Cited

U.S. PATENT DOCUMENTS

| | | | |
|---|---|---|---|
| 2014/0319350 A1* | 10/2014 | Yon | G01J 5/20 |
| | | | 250/338.4 |
| 2016/0023888 A1* | 1/2016 | Quevy | H05K 999/99 |
| | | | 257/414 |
| 2016/0221819 A1 | 8/2016 | Smeys et al. | |
| 2017/0098638 A1 | 4/2017 | Thuaire et al. | |
| 2018/0218997 A1 | 8/2018 | Fournel et al. | |
| 2018/0321087 A1 | 11/2018 | Leduc et al. | |
| 2018/0331155 A1 | 11/2018 | Leduc et al. | |

* cited by examiner

METHOD FOR MANUFACTURING A DETECTION DEVICE WITH TWO SUBSTRATES AND SUCH A DETECTION DEVICE

CROSS-REFERENCE TO RELATED APPLICATIONS

This application claims priority from French Patent Application No. 17 57589 filed on Aug. 8, 2017. The content of this application is incorporated herein by reference in its entirety.

TECHNICAL FIELD

The invention relates to the field of the detection of electromagnetic radiation such as electromagnetic radiation of which the wavelength is comprised in the infrared range, and targets more particularly detection devices enabling such a detection.

The subject matter of the invention is thus more precisely a method for manufacturing a device for detecting electromagnetic radiation and a device for detecting electromagnetic radiation.

PRIOR ART

In order to improve the sensitivity of the detection structures of certain detection devices, notably those intended for the detection of electromagnetic radiation of which the wavelength is comprised in the infrared range, it is known to house the detection structures of these devices in a cavity under at least a primary vacuum. In such a configuration, the structures are then thermally insulated from the remainder of the device by means of connecting arms which act as supports for said structure and which enable its electrical connection.

When this is the case, the method for manufacturing such a detection device is made more complex vis-à-vis those enabling the manufacture of structures simply encapsulated in a dielectric, in particular for transistor or diode based microbolometers.

Indeed, the formation of such devices, which are transistor or diode based microbolometers, generally requires the use of three different substrates assembled together, one comprising the reading circuit, the second comprising the detection structures and the third comprising the cap. The document US 20130026592 describes such a manufacturing method.

The manufacturing method according to the document US 20130026592 thus includes the following steps:
supplying a first substrate integrating a reading circuit, the first substrate further including at least two first contact plugs connected to the reading circuit,
supplying a second substrate comprising:
 a support,
 at least one detection structure, for the detection of electromagnetic radiation, provided with at least two connecting arms each extending by a second contact plug complementary to a corresponding first contact plug, the detection structure being arranged on the support,
 a sacrificial material deposited on the support and enclosing the detection structure in such a way that the second contact plugs are each at least in part exposed, bonding the second substrate on the first substrate with each of the second contact plugs bonded on the corresponding first contact plug,
elimination of the support,
opening of a trench in the sacrificial material surrounding the structure,
formation in the trench of a side wall surrounding the detection structure,
elimination of the sacrificial material so as to free the detection structure,
supplying a third substrate intended to form a cap,
assembling the third substrate on the side wall in order to form with the latter a cavity enclosing the detection structure, the assembly taking place under at least a primary vacuum.

With such a method it is thus possible to form a detection device comprising a structure having good thermal insulation vis-à-vis the remainder of the device since, apart from the thermal connection provided by the connecting arms of the structure, the structure is insulated by the vacuum produced in the cavity formed by the first substrate, the side wall and the third substrate.

Thus, although such a method makes it possible to supply a detection device with enhanced sensitivity, it has however the drawback of being relatively complex since it requires the assembly of three substrates, the first integrating the reading circuit, the second used for the supply of the structure and the third to form the cap.

DESCRIPTION OF THE INVENTION

The invention aims to overcome this drawback and thus notably relates to providing a method for manufacturing a detection device which, in making it possible to supply a detection device comprising a detection structure thermally insulated from the remainder of the detection device, is simpler vis-à-vis manufacturing methods of the prior art.

The invention relates to, in this respect, a method for manufacturing a device for detecting electromagnetic radiation, the method including the following steps:
supplying a first substrate, the first substrate integrating a reading circuit and comprising a first and a second surface, the first substrate further including at least two first contact plugs connected to the reading circuit and at least one first annular bonding element surrounding the first contact plugs, the first contact plugs and the first annular bonding element each being at least in part exposed on the first surface of the first substrate,
supplying a second substrate, the second substrate including:
 a first and a second surface of the second substrate,
 at least one detection structure, for the detection of electromagnetic radiation, provided with at least two connecting arms each extending by a second contact plug complementary to one corresponding first contact plug,
 a sacrificial material enclosing the detection structure and the connecting arms,
 a cap including the first surface of the second substrate,
 at least one annular side wall extending from the cap, the annular side wall forming with the cap a cavity housing the detection structure and the sacrificial material, the annular side wall being provided, on one end opposite to the cap, with a second annular bonding element complementary to the first annular bonding element, wherein the second contact plugs and the second annular bonding element are each at least in part exposed on the second surface of the second substrate, bonding the second surface of the second substrate on the first surface of the first substrate by bonding the second annular bonding element on the first annular bonding element and bonding the first contact plugs on the second contact plugs, arranging at least one opening in the second substrate, selective elimination of the sacrificial material, closing said opening under at least a primary vacuum whereby the device for detecting electromagnetic radiation is formed.

With such a method, the detection structure, the side wall and the cap are supplied by means of the single second substrate, it is thus not necessary to use a third substrate. The manufacturing method according to the invention thus makes it possible to obtain a detection device in which the detection structure(s) are thermally insulated from the remainder of the detection device without resorting to a third substrate. The manufacturing method according to the invention is thus simplified vis-à-vis those of the prior art.

It will also be noted that the invention also has the advantages of:

enabling the supply of a side wall of low thickness, on account of the use of the sacrificial material and the possibility of being able to produce the annular side wall in materials other than semiconductor materials, allowing the supply of a cap of small thickness, that is to say less than 50 µm, since the method is compatible with a step of thinning the cap, such as an etching step or a polishing step.

Concerning the "annular side wall" and "annular bonding element" terminologies, the term "annular" should be understood in that said side wall, or said bonding element, extends along a closed curved line and does not infer in any way that the shape of said closed curve is circular. Thus, each of the annular wall and the annular bonding element may also indeed extend along a circle as along a square, a hexagon, any polygon or any other shape, providing that said shape corresponds to a closed curved line.

"Sacrificial material" is taken to mean above and in the remainder of this document, and in accordance with the understanding of those skilled in the art, that the material is able to be etched selectively, the other elements of the intermediate device subjected to said selective etching, such as the detection structure and the connecting arms contained in said sacrificial material, not being etched by said selective etching either on account of their composition or on account of the presence of a protective layer not attacked by said selective etching.

Obviously, if each of the connecting arms extends by a respective second contact plug, this does not exclude in any way that such a contact plug, also known by those skilled in the art under the denomination of "contact pad", is not common with a connecting arm of another structure adjacent to the structure comprising said arm.

The method may further comprise a step of thinning the cap.

With such a possibility, it is possible to form a component according to the invention with a particularly thin cap. In this way it is possible to optimise the transmission rate of the cap and thus the sensitivity of the detection structure.

The annular side wall may comprise at least one sub-wall made of a material selected from copper, silicon and tungsten.

Such a sub-wall makes it possible to ensure good leak tightness of the cavity.

The annular side wall may comprise at least one barrier layer adapted to contain the diffusion of a part of at least one material constituting the annular side wall, said barrier layer being preferentially made of a material selected from titanium nitride, an alloy of titanium tungsten and tantalum nitride.

With such a barrier layer, it is possible to use materials such as copper and tungsten without this being a risk of perturbation for the operation of the device since said materials are contained by the barrier layer.

During the step of supplying the first substrate, at least two first annular bonding elements according to a nested configuration may be provided.

During the step of supplying the second substrate, the annular side wall may include at least two sub-walls according to a nested configuration each corresponding to a respective first annular bonding element, each of the sub-walls comprising a second annular bonding element corresponding to said first annular bonding element, and during the step of bonding the second surface of the second substrate on the first surface of the first substrate, each of the second annular bonding elements may be bonded on the corresponding first annular bonding element.

With such a configuration including a plurality of sub-walls in a nested configuration, it is possible to supply a cavity having good leak tightness since said leak tightness is ensured by each of the sub-walls of the annular side wall. It will be noted that such a configuration also ensures good rigidity with a lesser quantity of material, while taking into account the design constraints of microelectronics.

During the supply of the second substrate, the cap may further comprise a reinforcement material in a space between the sub-walls.

Such a reinforcement material makes it possible to ensure good cohesion between the sub-walls while ensuring good leak tightness.

The second substrate may further comprise a base, said base comprising the second surface of the substrate and being arranged to close the cavity formed by the cap and the at least one annular side wall, wherein the second contact plugs and the second annular bonding element may each be at least in part included in the base.

With such a base, the cavity is entirely formed in the second substrate and is thus already closed before the bonding on the first substrate. Thus, with this configuration, the bonding on the first substrate makes it possible to perfect the leak tightness of the cavity, said cavity being closed by the base and by the first substrate.

During the steps of supplying the first and the second substrate at least one of the first and the second substrates may comprise at least one layer of getter with an adapted layout so that after bonding the second substrate on the first substrate and the selective elimination of the sacrificial material, said layer of getter communicates with the cavity.

Such a getter makes it possible to guarantee the quality of the vacuum in the cavity throughout the lifetime of the device.

During the step of supplying the second substrate, the detection structure may be a MOS-FET transistor.

Such a manufacturing method is particularly advantageous for the supply of a device including a MOS-FET transistor since it necessitates resorting to only two substrates, unlike the method of the prior art which requires three substrates.

The step of supplying the second substrate may comprise the following sub-steps:
- supplying a substrate of the semiconductor layer on insulator type, the substrate of the semiconductor layer on insulator type including a support, an insulator layer formed of a sacrificial material and a semiconductor layer,
- selective elimination of a part of the semiconductor layer in order to delimit a corresponding portion of layer at the surface of the MOS-FET transistor,
- localised implantation of a doping element of a first type of conductivity in the portion of semiconductor layers, of a first and a second semiconductor zone, the first and second semiconductor zones being separated from each other by a third semiconductor zone, non-implanted,
- localised deposition of an insulator layer covering at least the third semiconductor zone,
- localised deposition of an absorption layer in contact with the insulator layer with a layout making the absorption layer able to polarise the third semiconductor zone,
- deposition of a protective layer covering the absorption layer and the exposed parts of the insulator layer,
- deposition of a first layer of sacrificial material, the first layer of sacrificial material enclosing the semiconductor layer, the insulator layer, the absorption layer and the protective layer,
- formation of the first and the second connecting arms comprising respectively the first and the second conduction track to enable the polarisation of the transistor, the first connection track being connected to the second zone, the second connection track being connected to the first zone and to the absorption layer by placing them in short-circuit,
- deposition of a second layer of sacrificial material, the first layer of sacrificial material enclosing the first and the second connecting arms,
- formation of the annular side wall through the layer of dielectric material and the first and second layers of sacrificial material, the annular side wall being in contact with the support so as to form with the support a cavity,
- formation of the second annular bonding element and the second contact plugs so as to form the second substrate (and doing this with the second contact plugs and the second annular bonding element at least in part exposed on the second surface of the second substrate).

During the sub-step of supplying a substrate of the semiconductor layer on insulator type of the step of supplying the second substrate, the support includes an optical treatment.

Such an optical treatment makes it possible to optimise the transmission rate of the cap of the device which is formed during the implementation of the method according to the invention.

The invention further relates to a device for detecting electromagnetic radiation including:
- a first substrate, the first substrate integrating a reading circuit and comprising a first and a second surface, the first substrate further including at least two first contact plugs connected to the reading circuit and at least one first annular bonding element surrounding the first contact plugs, the first contact plugs and the first annular bonding element each being at least in part exposed on the first surface of the first substrate,
- at least one detection structure, for the detection of electromagnetic radiation, provided with at least two connecting arms each extending by a second contact plug complementary to a corresponding first contact plug, each of the second contact plugs being bonded to the corresponding first contact plug,
- at least one cap,
- at least one annular side wall extending from the cap and forming with the cap a cavity housing the detection structure, the annular side wall being provided, on one end opposite to the cap, with a second annular bonding element complementary to the first annular bonding element, the second annular bonding element being bonded to the first annular bonding element with the first substrate, the cap and the annular side wall contributing to the formation of a closed cavity having at least a primary vacuum.

Such a device is easy to obtain since it may be obtained by means of the method according to the invention. It thus only requires two substrates to form it, which makes it possible to reduce manufacturing costs.

The cap may have a thickness comprised between 1 µm and 100 µm, preferentially comprised between 5 µm and 50 µm and advantageously between 10 µm and 30 µm.

With such a cap, the device has optimised sensitivity, since the rate of transmission of electromagnetic radiation by the cap in the direction of the detection structure is itself optimised.

The annular side wall may comprise at least two sub-walls according to a nested configuration.

With such a configuration of the annular side wall, the device comprises a cavity having good leak tightness since this is ensured by each of the sub-walls.

The detection structure may be a MOS-FET transistor.

BRIEF DESCRIPTION OF THE DRAWINGS

The present invention will be better understood on reading the description of exemplary embodiments, given for illustrative purposes and in no way limiting, while referring to the appended drawings in which.

Identical, similar or equivalent parts of the different figures bear the same numerical references so as to make it easier to go from one figure to the next.

The different parts represented in the figures are not represented according to a uniform scale, in order to make the figures more legible.

The different possibilities (alternatives and embodiments) should be understood as not being mutually exclusive and may be combined together.

DETAILED DESCRIPTION OF PARTICULAR EMBODIMENTS

Figure 1:
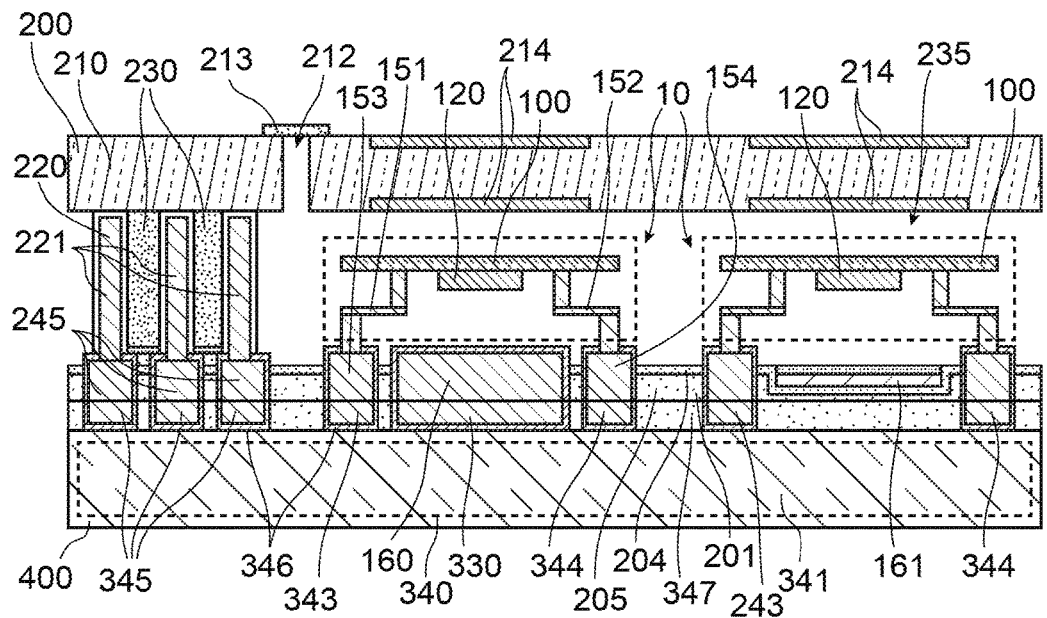
FIG. 1 illustrates a schematic longitudinal sectional view of a detection device according to a first embodiment of the invention.

FIG. 1 illustrates a detection device 1 according to the invention for the detection of electromagnetic radiation.

The invention targets in particular detection devices dedicated to the detection of electromagnetic radiation of which the wavelength is comprised in the infrared wavelength range. Thus, the different values indicated in the embodiments described hereafter concern a practical application in which the targeted wavelength range is the far infrared, that is to say between 8 and 12 μm. Obviously, those skilled in the art are perfectly capable, from the present disclosure, of adapting these values in order to enable, with the aid of such a detection structure 10, the optimised detection of electromagnetic radiation in another wavelength range, whether said range is comprised in the infrared or not.

Such a device 1 for detecting electromagnetic radiation comprises:
- a first substrate 341, the first substrate 341 integrating a reading circuit 340 and comprising a first and a second surface, the first substrate 341 further including first contact plugs 343, 344 connected to the reading circuit 340 and three first annular bonding elements 345 surrounding the first contact plugs 343, 344, the first contact plugs 343, 344 and the first annular bonding elements 345 each being at least in part exposed on the first surface of the first substrate 341,
- a plurality of detection structures 10, for the detection of electromagnetic radiation, each provided with at least two connecting arms 151, 152 each extending by a second contact plug 153, 154 complementary to a corresponding first contact plug 343, 344, each of the second contact plugs 153, 154 being bonded to the corresponding first contact plug 343, 344,
- a cap 210, and
- an annular side wall 220 extending from the cap 210, the cap and the annular side walls 220 together forming a cavity housing the detection structures 10, the annular side wall 220 comprising three concentric sub-walls 221 and each of these sub-walls 221 being provided, on one end opposite to the cap 210, with a second annular bonding element 245 complementary to the first annular bonding element 345, each of the second annular bonding elements 245 being bonded to the corresponding first annular bonding element 345, the cap 210 and the annular side wall 220 forming a closed cavity having at least a primary vacuum.

It is to be noted that within the scope of the present description of the invention, each of the detection structures 10 described is a MOS-FET type transistor 100. Obviously, the invention is not limited to this single type of detection structure, those skilled in the art being capable, from the teaching of the present document and their general knowledge, of applying the invention to any type of detection structure. The invention may also apply, in particular and in a non-limiting manner, to bolometers and to photodiodes.

MOS-FET transistor, the terminology generally used by those skilled in the art, is taken to mean above and in the remainder of this document a field effect transistor of the metal/oxide/semiconductor type. Indeed, the acronym MOS-FET stands for "Metal-Oxide-Semiconductor Field-Effect-Transistor".

It will also be noted that if the annular side wall 220 comprises in this first embodiment three sub-walls 221, it may obviously comprise a different number thereof without going beyond the scope of the invention. It will thus be noted, in particular, that the annular side wall 220 may be formed of a single one-piece wall without going beyond the scope of the invention.

Thus, within the scope of this embodiment and with reference to FIGS. 2A to 2D, each of the detection structures 10 comprises:
- a transistor 100 of the MOS-FET type comprising:
  - at least one first and at least one second semiconductor zone 111, 112 of a first type of conductivity,
  - at least one third semiconductor zone 113 separating the first and the second semiconductor zones 111, 112 from one another, the third semiconductor zone 113 being of a type of conductivity in which the third zone is substantially empty of carriers, in other words the third semiconductor zone 113 is totally depleted,
  - a gate 120 arranged to polarise the third semiconductor zone 113, the gate 120 comprising a first dielectric layer and an absorption layer 125 made of a metal of the "mid-gap" type for the third zone, this metal being preferentially made of titanium nitride TiN and the absorption layer 125 forming absorbent element,
- a first and a second connecting arm 151, 152 comprising respectively a first and a second conduction track 162, 165 to enable the polarisation of the transistor 100, the first connection track 162 being connected to the second semiconductor zone 112, the second connection track 165 being connected to the first semiconductor zone 111 and to the absorption layer 125 by placing them in short-circuit,
- first and second contact plugs 153, 154 respectively extending the first and the second connecting arms 151, 152,
- a reflection surface 160 arranged so as to form with the absorption layer 125 a quarter-wave cavity.

It will be noted that in such a configuration, the first semiconductor zone 111 forms the drain of the transistor, the second semiconductor zone 112 forms the source of the transistor and the third semiconductor zone 113 the channel of the transistor 100. Thus the transistor 100 operates in low insertion, the drain and the gate being in short-circuit and the source-drain $V_{SD}$ and source-gate $V_{SG}$ voltages being equal.

The first to the third semiconductor zones 111, 112, 113 are all three laid out in a semiconductor layer 101 made of a semiconductor material, such as silicon Si, germanium Ge and silicon carbide SiC. The thickness of the semiconductor layer 101 is adapted in order to supply a third depleted semiconductor zone 113.

Type of conductivity in which the third semiconductor zone 113 is substantially empty of carriers should be taken to mean above and in the remainder of this document that the third semiconductor zone 113 has a type of conductivity and a thickness such that, in the absence of polarisation of the detection structure 10, the third semiconductor zone 113 is substantially empty of carriers. Obviously, in operation and during the application of a polarisation on the absorption layer 125, the creation of a conduction channel makes it possible to populate the third semiconductor zone 113 with carriers of the first type of conductivity. It is possible to note that for those skilled in the art the indication according to which "the third zone is depleted" is synonymous with such a type of conductivity in which the third zone is substantially empty of carriers.

The absorption layer 125 is made of a metal of the "mid-gap" type for the third semiconductor zone 113, the absorption layer 125 being preferentially made of a metal chosen from the group comprising titanium nitrides, tantalum nitrides and molybdenum silicides for a third semiconductor zone 113, and thus a semiconductor layer 101, made of silicon, the absorption layer 125 being advantageously made of titanium nitride TiN for a third semiconductor zone 113 made of silicon.

Above and in the remainder of this document "mid-gap type metal" is taken to mean that the metal is chosen so as to have, in the absence of polarisation of the structure, its Fermi energy in the forbidden band zone of the third zone and more precisely in the vicinity of the middle of the forbidden band of the third zone, typically at a level of energy distant from the middle of the forbidden band in a range comprised between −25% and +25% of the forbidden band gap. Such a gate configuration is generally known to those skilled in the art under the denomination "mid-gap". Thus in the case where the third zone is made of silicon, "mid-gap type metals" comprise notably titanium nitrides, tantalum nitrides and molybdenum silicides.

It may be noted that such a configuration may notably be obtained with an absorption layer 125 made of titanium nitride TiN of 10 nm thickness.

It will be noted that according to an alternative of the invention illustrated in FIG. 1, the reflection surface 160 may be substituted by a sorbent material 161, also known as a "getter". Such a getter is a material having a particularly reactive surface so as to enable chemisorption of potential residual gases found in the cavity. It thus makes it possible to ensure a pumping of the cavity throughout the lifetime of the detection device 1 in order to avoid a potential rise in pressure in the cavity linked to degassing.

In a particularly advantageous manner, this getter 161 may be adapted to also form a reflection surface with an arrangement adapted to form with the absorption layer 125 a quarter-wave cavity.

The getter 161 may be selected from the group comprising titanium, zirconium, vanadium, chromium, cobalt, iron, manganese, palladium, barium, aluminium and alloys thereof.

Each of the detection structures is connected to the reading circuit 340 by means of connecting arms 151, 152 and the corresponding first and second contact plugs 153, 154, 343, 344.

Figure 2A:
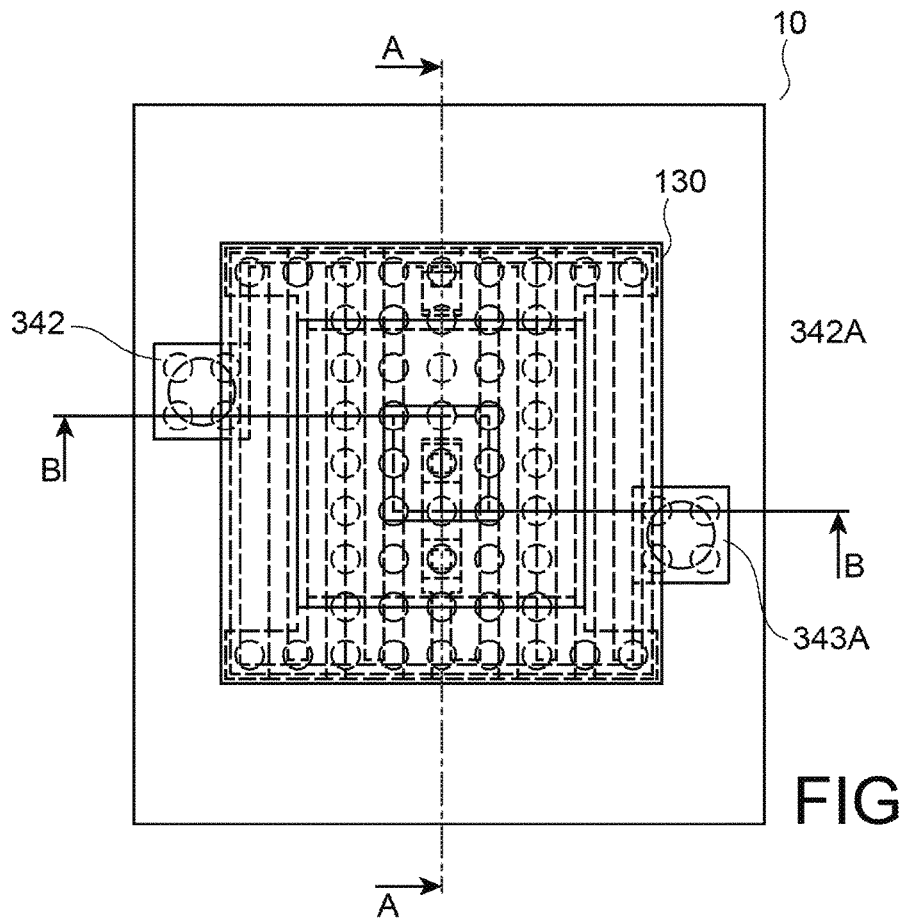
FIGS. 2A to 2D illustrate respectively a top view, a sectional view along the sectional line A-A, a sectional view along the sectional line B-B and a top sectional view along the sectional line C-C of a detection structure equipping a device according to the invention.
Figure 2B:
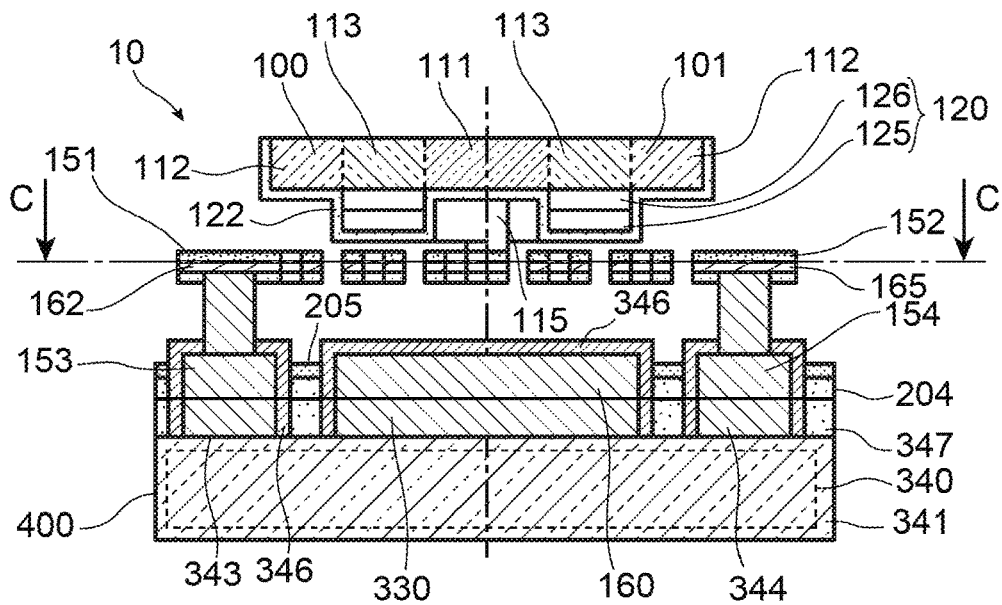
Figure 2C:
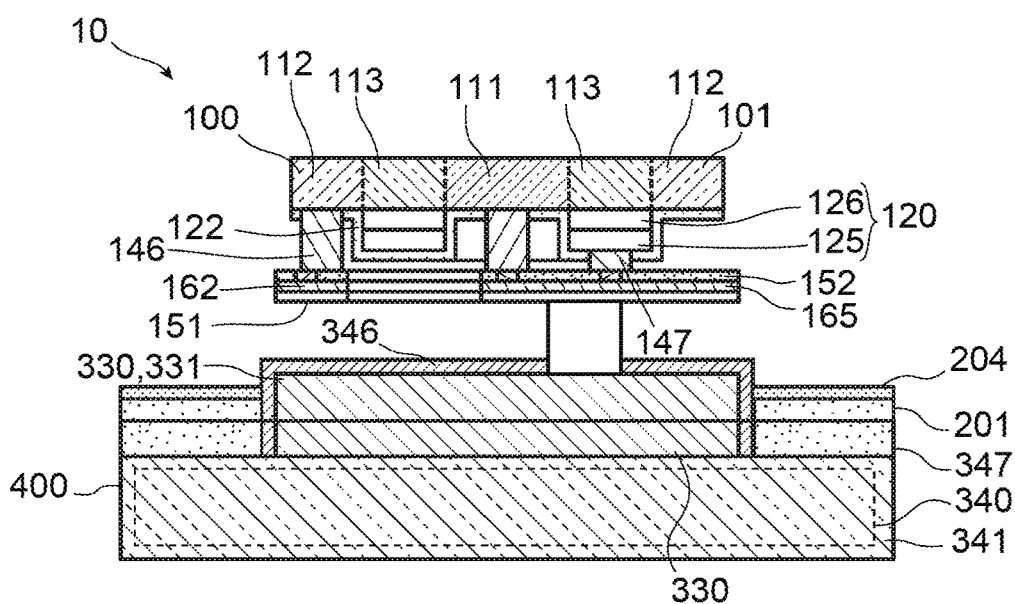
Figure 2D:
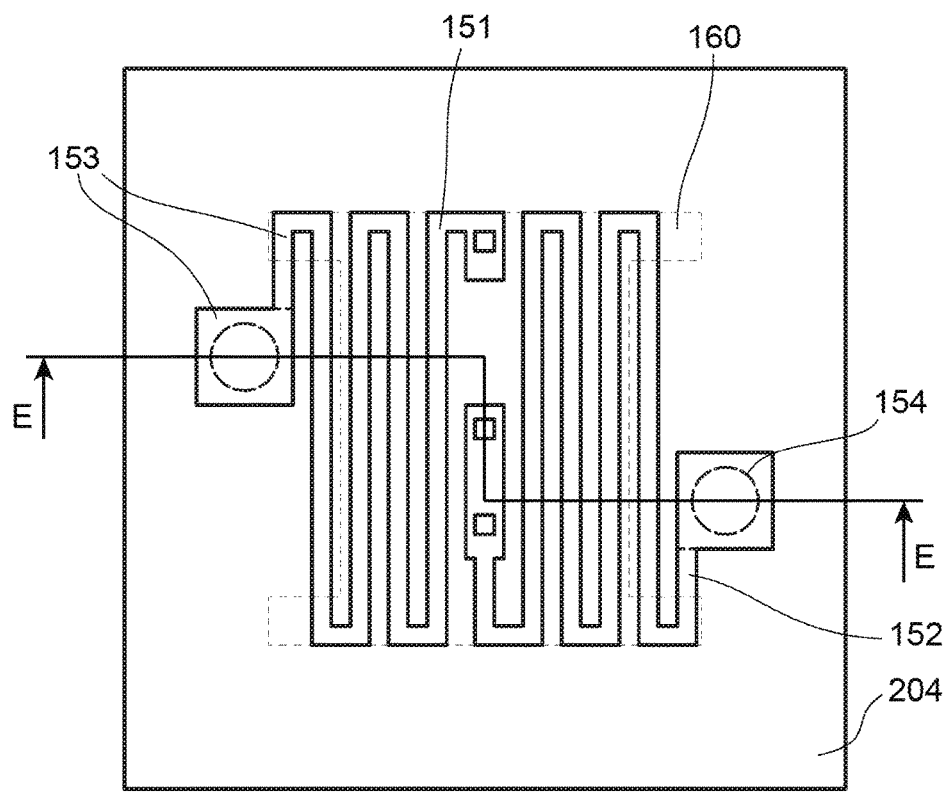

The reading circuit 340 is, as illustrated in FIGS. 2B and 2C, laid out in the first substrate 341 which is a semiconductor substrate, such as a silicon substrate, in which are arranged the components of the reading circuit 340. The reading circuit 340 is configured to polarise the detection structures 10 and to determine, from an operating current of the transistor 100, a rise in temperature of the absorption layer 125. Such a reading circuit 340 is uniquely represented by means of dotted lines representing its emplacement in the first substrate 341. Such a reading circuit 340 is of a type known to those skilled in the art and may thus also indeed comprise a plurality of reading sub-circuits each dedicated to a single corresponding transistor 100, or a shared circuit for a group or for all the transistors 100 equipping the detection device 1 or instead a reading circuit 340 composed of a part dedicated to a single transistor 100 and of a shared part for a group or for all the transistors 100 equipping the detection device 1. Such reading circuits 340, generally of MOS technology, being known to those skilled in the art, they are not described more precisely in this document.

Obviously, in accordance with the knowledge of those skilled in the art, this reading circuit is adapted to the type of detection structures 10 equipping the detection device 1.

In order to ensure the connection between the reading circuit 340 and each of the transistors 100, the first substrate 400 comprises, exposed on the first surface of the semiconductor support 341, first and second first contact plugs 343, 344. The first and the second contact plugs 343, 344 are made of a metal material adapted to form an Ohmic contact with the reading circuit 340 and allowing bonding of the second contact plugs 153, 154 on the first contact plugs 343, 344. Thus, such a metal material may be, for example, made of copper Cu, titanium Ti or tungsten W. The first contact plugs 343, 341, within the scope of a practical application of the invention, may have a surface of 1 μm by 1 μm.

The first surface of the first substrate 341 is also provided, as illustrated in FIG. 2B, in correspondence with each of the detection structures 10, with a metal layer 330 to enable the formation of a bonding portion in order to bond the reflection surface 160. Thus, each of the metal layers 330 extends on a portion of the first surface of the first substrate 340 that is facing the corresponding detection structure 10. It will be noted that in the practical application of the invention, the surface occupied by each of the detection structures 10 may be a surface of 5 μm by 5 μm. In the same way as the first contact plugs 343, 344, they may be made of copper Cu, titanium Ti or tungsten W.

The first substrate 341 also comprises, as illustrated in FIG. 1, the three first annular bonding elements 345 exposed on the first surface of the first substrate 341. The three first annular bonding elements 345 are made of a material adapted to bonding of the second annular bonding elements 245 on the first annular bonding elements 345. Thus the first annular bonding elements 345 are preferentially made of copper Cu, obviously other materials may also be envisaged without going beyond the scope of the invention. More precisely, the first annular bonding elements 345 may be made of a material selected from the group comprising copper Cu, titanium Ti, and tungsten W.

Each of the first annular bonding elements 345 extends along a closed curved line enclosing the first contact plugs 343, 344 and the metal layers 330. The first annular bonding elements 345 fit together with each other, with the outermost first annular bonding element 345 which contains the other first annular bonding elements 345 and with the innermost first annular bonding element 345 which is contained by the other first annular bonding elements 345. Thus, the first annular bonding elements 345 have a nested configuration.

Parts of the first surface of the first substrate 400, which do not include the first and the second connection plugs 342, 343, the first annular bonding elements 345 and the metal layer 330, comprise a first passivation layer 347. The first passivation layer 347 is preferentially adapted for bonding with a layer of the same type as the second substrate 200. It may be noted that according to one possibility of the invention, such a passivation layer with each of first and second connection plugs 342, 343 and the metal layer 330 which is flush with the first surface may be provided by a Damascene method. The first passivation layer 347 is made of a dielectric material such as silicon dioxide $SiO_2$ or silicon nitride $Si_xN_y$.

It will be noted that within the scope of the alternative of the invention wherein the reflection surface 160 is substituted by a sorbent material 161, no metal layer 330 is provided and the corresponding portion of the first surface of the first substrate 400 includes the first passivation layer 347 as illustrated in FIG. 1.

It is also to note that in the case where at least one among the first contact plugs 343,344, the metal layers 330 and the first annular bonding elements 345 is made of copper Cu, this may comprise, as illustrated in FIGS. 1 and 2A to 2D and on a part of its surface, a so-called barrier layer 346 in order to avoid any diffusion of the copper Cu into the passivation layer 347. It will be noted that, in this case, the surfaces intended to act as bonding surface are without barrier layer 346.

It will be noted that such a barrier layer is also advantageous in the case where at least one among the first contact plugs 343,344, the metal layers 330 and the first annular bonding elements 345 is made of tungsten W or titanium Ti.

The barrier layer may be:
in the case where at least one among the first contact plugs 343,344, the metal layers 330 and the first annular bonding elements 345 is made of copper, titanium nitride TiN, an alloy of titanium tungsten TiW or tantalum nitride TaN;
in the case where at least one among the first contact plugs 343,344, the metal layers 330 and the first annular bonding elements 345 is made of tungsten W or titanium Ti, titanium nitride TiN or an alloy of titanium tungsten TiW.

With the passivation layer 347, the contact plugs 343, 344, the three first annular bonding elements 345 and the metal layer 330, the first substrate 400 is adapted to enable the bonding of the second substrate 200 comprising the detection structures 10, the side walls 220 and the cap 210.

The supply of the first substrate 400 may consist in the following sub-steps:
supplying a first semiconductor support 341,
arranging in the first semiconductor support 341 the reading circuit 340 by resorting notably to conventional lithography techniques for those skilled in the art,
forming, according to a Damascene formation method, the first contact plugs 343,344, the metal layers 330 and the first annular bonding elements 345.

Obviously, if the contact plugs 343,344, the metal layers 330 and the first annular bonding elements 345 are preferentially formed by a Damascene formation method, other lithography techniques known to those skilled in the art may also be envisaged without going beyond the scope of the invention.

Figure 3:
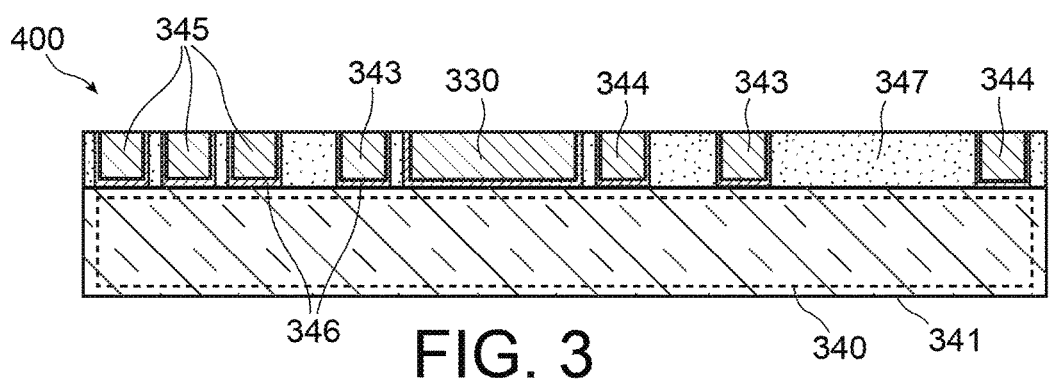
FIG. 3 illustrates a first substrate used during the implementation of a method for manufacturing the detection device according to the first embodiment of the invention.

FIG. 3 thus illustrates the first substrate 400 before bonding of the second substrate 200 for the formation of the detection device 1 illustrated in FIG. 1.

Figure 4A:
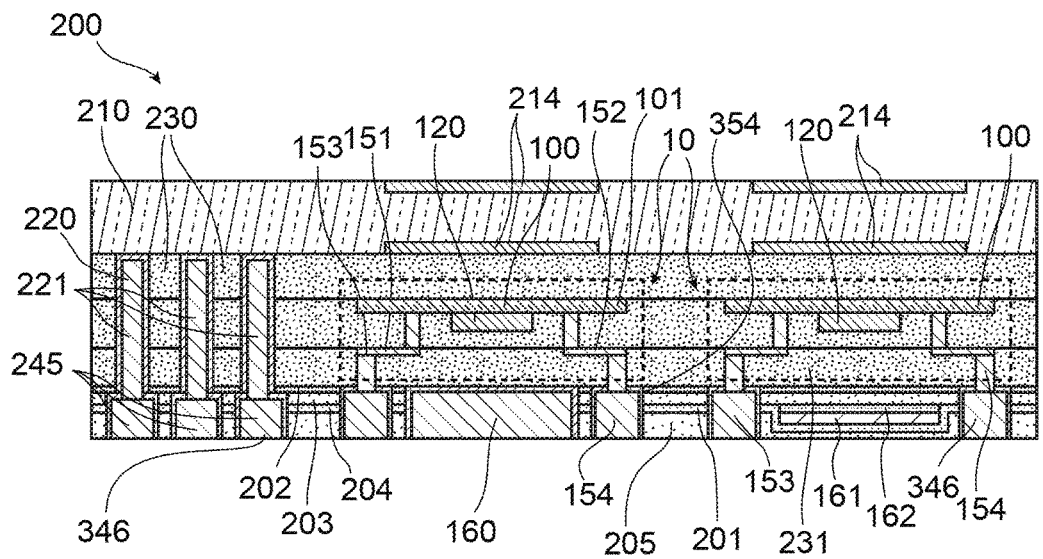
FIGS. 4A and 4B illustrate respectively a second substrate used during the implementation of the method for manufacturing a device according to the first embodiment of the invention and a support used for the formation of said second substrate.

FIG. 4A illustrates the second substrate 200 before its bonding on the first substrate 400.

The second substrate 200 comprises:
the cap 210 comprising a first surface of the second substrate 200,
the sub-walls 221 of the annular side wall 220 extending from the cap 210 and forming with the latter a cavity 340 housing the detection structures 10, the space between two consecutive sub-walls 221 being filled with a reinforcement material 230, each of the sub-walls 221 being provided, on one end opposite to the cap 210, with a second annular bonding element 245 complementary to a corresponding first annular bonding element 345,
a sacrificial material 231 enclosing the detection structure 10 and filling the cavity 235 formed by the cap 210 and the annular side wall 220,
a base 201 comprising the second surface of the second substrate 200, the second contact plugs 153, 154 and the second annular bonding elements 245 each being arranged in said base 201 while being exposed on the second surface of the second substrate 200.

The cap 210 may comprise, facing each of the detection structures 10, as illustrated in FIG. 3, at least one portion of a surface 214 optically treated by means of an optical treatment such as an antireflection film or a surface structuring, in order to confer on it antireflection properties, or a filter in order to filter a part of the electromagnetic radiation such as for example the part of the electromagnetic radiation corresponding to the far infrared. In FIG. 4A, the cap 210 comprises, on each of these surfaces, optically treated surface portions 214 in order to confer on it antireflection properties.

Each of the sub-walls 221 extends substantially perpendicularly from the cap 210 along a closed curved directing line so as to form with the cap 210 a cavity 235 enclosing the detection structures 10. The sub-walls 221 fit together with each other, with the outermost sub-wall 221 which contains the other sub-walls 221 and with the innermost sub-wall 221 which is contained by the other sub-walls 221. Thus, the sub-walls 221 have a nested configuration.

It may be noted that to facilitate the bonding of each second annular bonding element 245 on the corresponding first annular bonding element 345, the closed curved directing lines of the sub-walls 221 each correspond preferentially to the closed curved line along which extends the corresponding first annular bonding element 345 of the first substrate 400. In this way, each of the second annular bonding elements 245 may extend along the same closed curved directing line of the corresponding sub-wall 221 without this hindering the bonding of said second annular bonding element 245 on the corresponding first annular bonding element 345.

The sub-walls 221 may be formed of material selected from the group comprising copper Cu, tungsten W and silicon Si, whether said material is in crystalline, polycrystalline or amorphous form.

The reinforcement material 230 may be the same material as the sacrificial material 231 enclosing the detection structure and be made of silicon dioxide $SiO_2$.

The base 201 comprises, starting from a surface facing the cap 210 in the direction moving away from the cap 210:
a second dielectric layer 202,
a third dielectric layer 203 covering the second dielectric layer 202,
a stop layer 204 covering the third dielectric layer 203,
a second passivation layer 205 covering the stop layer 204, the second passivation layer 205 forming the second surface of the second substrate 200.

The material of the second dielectric layer 202 may be selected from the group including silicon nitride $Si_3N_4$, hydrogenated amorphous silicon carbide aSiC:H, silicon carbide bound to silicon nitride or silicon carbide nitride, generally known under the denomination SiCN:H, and amorphous carbon aC. The thickness of the second dielectric layer 202 may be comprised between 100 and 20 nm, preferentially between 70 and 30 nm and in a particularly advantageous manner between 60 and 40 nm. The thickness of the second dielectric layer 202 may thus be substantially equal to 50 nm The material of the third dielectric layer 203 may be selected from the group including silicon carbide bound to silicon nitride or silicon carbide nitride, generally known under the denomination SiCN:H, and amorphous carbon aC. The thickness of the third dielectric layer 203 may be comprised between 100 and 20 nm, preferentially between 70 and 30 nm and in a particularly advantageous manner between 60 and 40 nm. The thickness of the second dielectric layer 202 may thus be substantially equal to 50 nm.

The material of the stop layer 204 is a material adapted to form a protective layer during a selective attack to eliminate the sacrificial material 231 and thus to free the cavity 235 of the sacrificial material 231. Thus, according to one preferred possibility according to which the sacrificial material 231, which is silicon dioxide $SiO_2$, the material of the stop layer is preferentially selected from the group comprising alumina $Al_2O_3$ and aluminium nitride AlN.

The second passivation layer 205 is made of a dielectric material which is adapted for bonding on the first passivation layer. Thus, the second passivation layer is preferentially made of the same material as that of the first passivation layer. The second passivation layer is advantageously made of silicon dioxide $SiO_2$.

The base 201 further comprises the second annular bonding elements 245, the second contact plugs 153, 154 and the reflection surface 160 which extends through the third dielectric layer 203, the stop layer 204 and the second passivation layer 205 while emerging on the second surface of the second substrate 200. The annular bonding elements 245 are laid out in contact with the sub-walls 221 in the extension thereof so as to ensure the hermeticity of the cavity 235. In the same way, the second contact plugs 153, 154 are laid out in electrical contact with the first and the second connecting arms 151, 152 in the extension of the latter.

Each of the second annular bonding elements 245 is adapted to allow bonding on the corresponding first bonding element 345 of the first substrate 400. Such an adaptation may notably be obtained by the supply of each of the second annular bonding elements 245 made of the same material as that of the corresponding first annular bonding element 345. In order to allow a hermetic sealing of the cavity 235 formed by the cap 210 and the annular side wall 220, each of the second annular bonding elements 245 extends along a closed directing line substantially identical to the closed directing line along which extends the corresponding first annular bonding element 345.

In the same way, each of the second contact plugs 153, 154 is adapted to allow bonding on the corresponding first contact plug 343, 345 of the first substrate 400. Such an adaptation may notably be obtained by the supply of each of the second contact plugs 153, 154 made of the same material as that of the corresponding first contact plug 343, 344. In an identical manner, each of the second contact plugs 153, 154 has, along a second bonding plane defined by the second surface of the second substrate 200, a dimensioning substantially identical to that of the corresponding first bonding plug 343, 344 along a first bonding plane defined by that of the first surface of the first substrate 400.

The reflection surface 160 has an adaptation, apart from its reflection properties, to authorise bonding on the metal layer 330. Such an adaptation may notably be obtained by the supply of a reflection surface 160 made of the same material as that of the metal layer 330. The reflection surface 160 has, along the second bonding plane, a dimensioning substantially identical to that of the metal layer 330 along the first bonding plane.

It is to be noted that in the case where at least one among the second contact plugs, 153, 154, the reflection surface 160 and the second annular bonding elements 245 is made of copper Cu, titanium Ti or tungsten W, this may comprise, as illustrated in FIGS. 1 and 2A to 2D on a part of its surface a so-called barrier layer 346 in order to avoid any diffusion of copper Cu, titanium Ti or tungsten W into the remainder of the base. It will be noted in addition that, in this case, the surfaces intended to act as bonding surface are without barrier layer 346.

Such a barrier layer is of the same type as that already described for the first substrate 400.

Figure 4B:
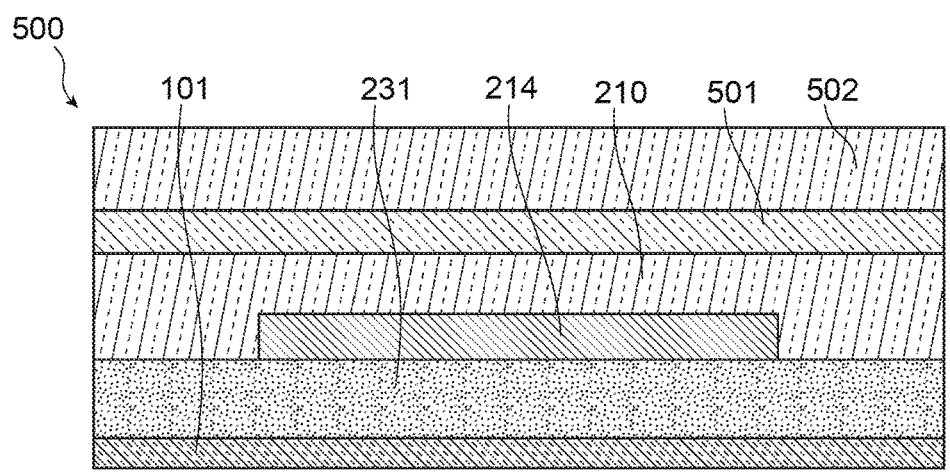

The step of supplying the second substrate 200 comprises the following sub-steps:
  supplying a substrate of the semiconductor on insulator type as illustrated in FIG. 4B, the substrate 500 comprising a support, an insulator layer made of a sacrificial material 231 and a semiconductor layer 101, the semiconductor layer 101 being preferentially depleted, the support comprising, facing the insulator layer, a portion of optically treated surface 214 each corresponding to a detection structure 10, a single portion of optically treated surface 214 being represented in FIG. 4B,
  localised etching of the semiconductor layer 101 in order to define the semiconductor layer 101 of each of the detection structures 10,
  localised implantation of a doping element of the first type of conductivity, in each of the semiconductor layers 101, of a first and a second semiconductor zone 111, 112, the first and second semiconductor zones 111, 112 being separated from each other by a third semiconductor zone 113, non-implanted, said zone thus being depleted,
  localised deposition of an insulator layer 126 covering at least the third semiconductor zone 113,
  localised deposition of an absorption layer 125 in contact with the insulator layer 126 and with a layout making it able to polarise the third semiconductor zone 113, the gate 120 being thereby formed,
  deposition of a protective layer 122 covering the absorption layer 125 and the exposed parts of the insulator layer 126,
  deposition of a first layer of sacrificial material 231, the first layer of sacrificial material 231 enclosing the semiconductor layer 101, the insulator layer 126, the absorption layer 125 and the protective layer 122,
  formation of the first and the second connecting arms 151, 152 comprising respectively the first and the second conduction tracks 162, 165 to enable the polarisation of the transistor 100, the first connection track 162 being connected to the second semiconductor zone 112, the second connection track 165 being connected to the first semiconductor zone 111 and to the absorption layer 125 by placing them in short-circuit,
  deposition of a second layer of sacrificial material 231, the second layer of sacrificial material 231 enclosing the first and the second connecting arms 151, 152,
  deposition of the second layer of dielectric material 202 in contact with the second filling layer,
  formation of the sub-walls 22A through the layer of dielectric material 202 and the first and second layers of sacrificial material 231, the sub-walls 221, and thus the annular side wall 220 that they form, being in contact with the support 500 so as to form with the support 500 a cavity 235, deposition of the third dielectric layer 203 covering the second dielectric layer 202, deposition of the stop layer 204 covering the third dielectric layer 202, in the case where a getter 161 is provided:

localised deposition of a second protective layer 162, such as for example a layer of amorphous carbon of 50 nm thickness, on at least one portion of the stop layer 204 corresponding to the getter 161, and deposition of the getter 161 in contact with the third protective layer at the level of the at least one portion corresponding to the getter 161, deposition of the second passivation layer 205 covering the stop layer and, if need be, the getter 161, the stop layer 204, the second passivation layer 205 forming the second surface of the second substrate 200.

formation of the second annular bonding elements 245, the second contact plugs and the reflection surface 160 through the second passivation layer 205, the stop layer 204 and the third dielectric layer 203, emerging respectively on the sub-walls 221, the first and the second connecting arm 151, 152 and on the stop layer.

The sub-steps of formation of the sub-walls 221, the second annular bonding elements 245, the second contact plugs 153, 154 and the reflection surface 160 may be a formation according to a Damascene formation method. Advantageously, these same sub-steps of formation of the annular side walls 220, the second annular bonding elements 245, the second contact plugs and the reflection surface 160 may comprise the following operations:

arranging annular openings each corresponding to one of the sub-walls 221 in the layer of dielectric material 202 and the first and second layers of sacrificial material 231, deposition of a layer of barrier material 346 in contact with the walls of said openings, filling the openings by the Damascene formation method in order to form the sub-walls 221 and thus the annular side wall 220.

The sub-step of formation of the second annular bonding elements 245, the second contact plugs 153, 154 and the reflection surface 160 may be implemented with operations of the same type.

It is also to be noted that, as shown in FIG. 4A, the sub-steps of formation of the first and the second connecting arms 151, 152 and deposition of the second layer of sacrificial material may be carried out in two stages. Thus, the sub-step of formation of the first and the second connecting arms 151, 152 may comprise a first operation consisting in forming a first portion of the first and second connecting arms 151, 152 and a second operation consisting in forming the second portion. Similarly, the sub-step of deposition of the second layer of sacrificial material may include an operation of deposition of a first sub-layer of sacrificial material enclosing the first portion of the first and the second connecting arms 151, 152 intermediate between the operations of formation of the first and second connecting arms 151, 152. The sub-step of deposition of the second layer of sacrificial material may then further include a second operation of deposition of a second sub-layer of sacrificial material enclosing the second portion of the first and the second connecting arms 151, 152 after the operations of formation of the first and second connecting arms 151, 152.

Within the scope of this method, the cap 210 is formed by the support 500. In order to supply a cap 210 having an optimised thickness, a step of thinning the cap 210, that is to say the support 500, may advantageously be provided. Thus, in the case where the support comprises, as is the case in the present embodiment and as illustrated in FIG. 4B, an intermediate layer 501 to stop the etching, such a thinning step may comprise the following sub-steps:

etching the part 502 of the support 500 opposite to the semiconductor layer 101 on insulator, the etching being stopped by means of the intermediate layer 501, elimination of the intermediate layer 501, the remainder of the support 500 forming the thinned cap 210.

In this way, it is possible to control precisely the thickness of the cap 210 after etching.

With such a thinning step, it is possible to supply a cap 210 having reduced thickness in order to optimise the transmission of electromagnetic radiation through the cap 210. Thus, the cap 210, after the thinning step, may have a thickness comprised between 1 µm and 100 µm, preferentially comprised between 5 µm and 50 µm and advantageously between 10 µm and 30 µm.

Obviously, such a step of thinning the cap 210 may take place equally well within the scope of the step of supplying the second substrate 200 or after the supply of the substrate 200.

Apart from the steps of supplying the first and the second substrate already described, the method of formation of a detection device 1 comprises the following steps:

bonding the second surface of the second substrate 200 on the first surface of the first substrate 400 by bonding the second annular bonding elements 245 on the first annular bonding elements 345 and bonding the first contact plugs 153, 154 on the second contact plugs 343, 344, thinning the support 500 in order to supply a cap 210 with a controlled thickness, arranging at least one opening in the second substrate 212, selective elimination of the sacrificial material 231 corresponding to the first and second layer of sacrificial material 231, the selective elimination also making it possible to eliminate or to make porous the second dielectric layer 202 and the third dielectric layer 203, subjecting the assembly of the first and the second substrate 400, 200 to an attack adapted to eliminate the protective layer 162 in order to free the layer of sorbent material 161.

closing said opening under at least a primary vacuum, whereby the device 1 for detecting electromagnetic radiation is formed, said closing being able to be realised by means of a protective cover 213, as illustrated in FIG. 1.

In the case where, as is illustrated in FIG. 4A, an optical treatment is provided at the level of the first surface of the second substrate 200, after an optional step of thinning the cap 210, a step of application of an optical treatment 214 on the parts of the first surface of the substrate 210 which are facing a detection structure 100 may be provided. Obviously, as illustrated in FIG. 4B, it may also be envisaged, in an alternative or as a complement, that the support comprises, facing the semiconductor layer 101 on insulator, an optical treatment 214. Thus, in the case of the second substrate 200 illustrated in FIG. 4A, an optical treatment is provided on each of the faces of the cap facing each of the detection structures 100.

Thus, the step of supplying the second substrate may comprise a step of carrying out an optical treatment 214 on one or both faces of the cap 210 facing at least one structure 100. In an alternative, notably for an optical treatment on the face of the cap 210 which is opposite to the optical structure, the manufacturing method may comprise a step of carrying out an optical treatment 214.

Obviously, although such optical treatments 214 are advantageous within the scope of the invention, a detection device 1 according to the invention may be perfectly functional while being exempt of such optical treatments.

Figure 5:
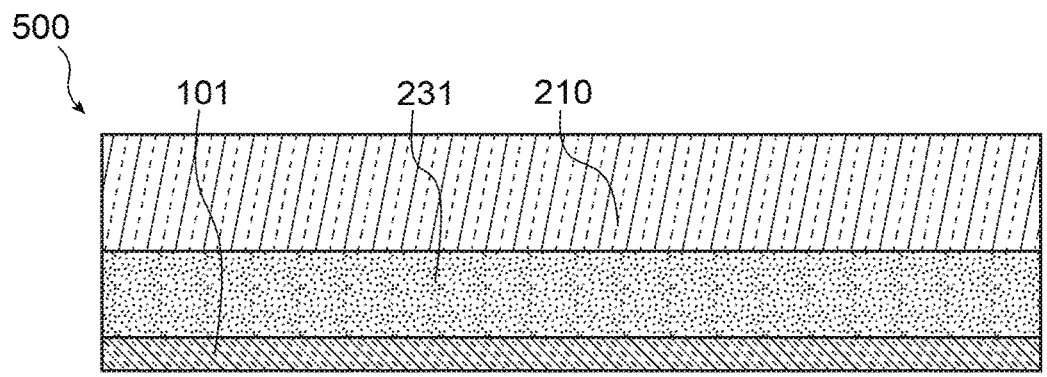
FIG. 5 illustrates a support for the formation of a second substrate of the device according to a second embodiment in which the support is without intermediate stop layer and optical treatment, FIG. 6 schematically illustrates a top view of a detection device according to the invention showing an example of layout of the detection structures, FIG. 7 schematically illustrates the annular side walls of a detection device according to an alternative of the invention in which said side walls are reinforced by means of internal reinforcement pillars.

Thus, FIG. 5 illustrates a support 500 for the formation of a second substrate 200 for a detection device 1 according to a second embodiment wherein no portion of optically treated surface 214 is provided and no intermediate layer is provided.

Such a detection device 1 differs from a device according to the first embodiment in that the device is without portion of optically treated surface 214 and in that during the step of supplying the second substrate, if a sub-step of thinning the cap 210 is provided, such a thinning does not use an intermediate layer in order to be able to control the thickness of the cap 210.

Figure 6:
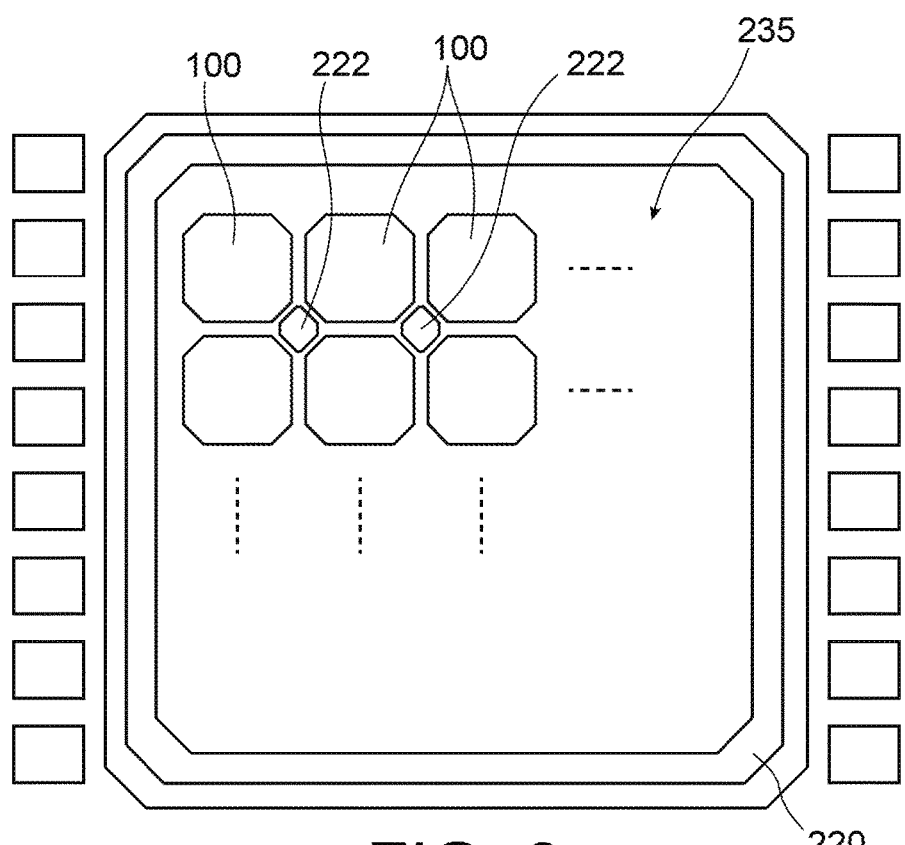

FIG. 6 illustrates a schematic top view of a detection device 1 according to the first embodiment, said FIG. 6 representing the layout of the structures and the possibility of the supply of reinforcement pillars 222 in the cavity 235. Such reinforcement pillars 222 make it possible to support the cap in order to reduce, or even eliminate, the risks of collapse of the cap 210.

Such reinforcement pillars 222 may be positioned between the detection structures with a regular distribution. In the configuration illustrated in FIG. 5, the reinforcement pillars are arranged at the intersection between four detection structures 100. Obviously, such a distribution is only indicative and is provided as a non-limiting example.

Each reinforcement pillar 222 may have a configuration similar to that of a sub-wall 221 and be formed of copper Cu, silicon Si or tungsten W with a barrier layer 346, or instead be formed by an annular wall including at its centre a reinforcement material 230, such as for example the sacrificial material. According to another possibility of the invention, each reinforcement pillar 222 may be formed of silicon $SiO_2$.

The method for manufacturing a detection device 1 according to this second embodiment differs from a method for manufacturing a detection device 1 according to the first embodiment in that during the sub-step of formation of the sub-walls 220 reinforcement pillars 222 are also formed.

Figure 7:
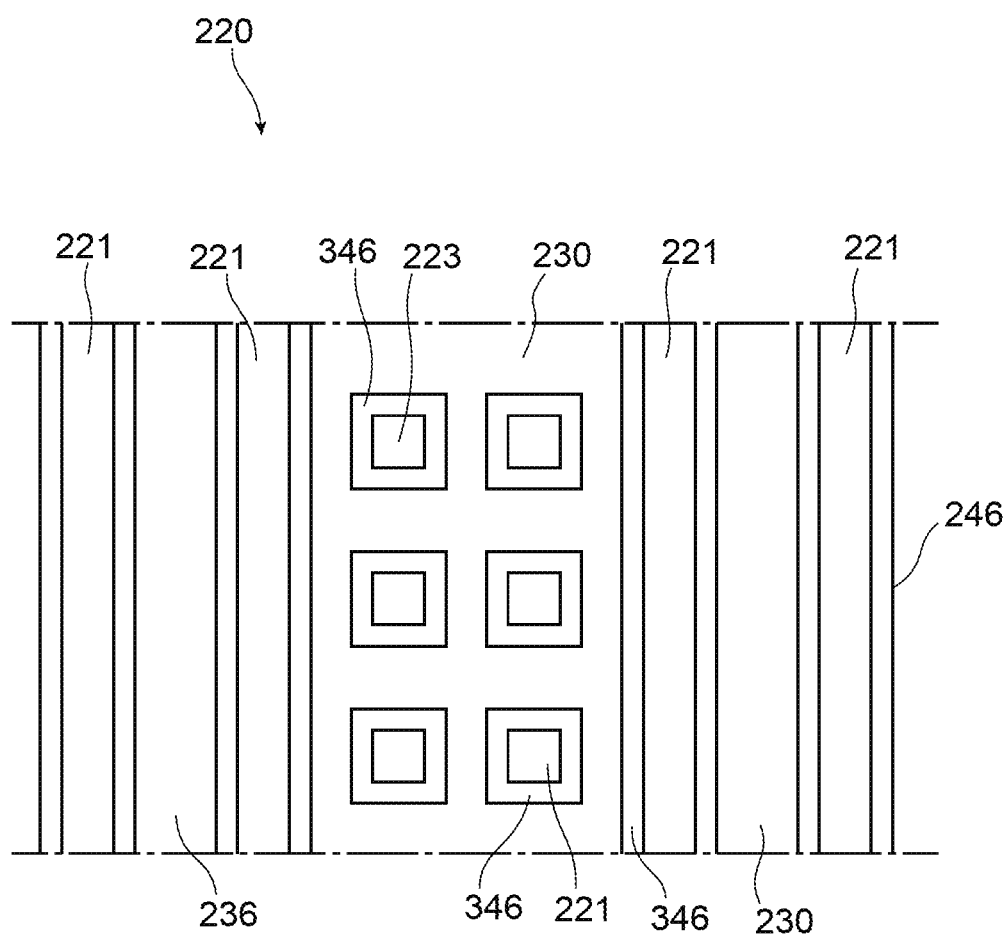

FIG. 7 illustrates an example of configuration of sub-walls 221 to form the annular side wall 220 in an alternative to that presented in relation with FIG. 1. According to this configuration, four sub-walls 221, two inner sub-walls 220 and two outer sub-walls 221, are provided. The inner sub-walls 221 are separated from the outer sub-walls 221 by an internal space filled with reinforcement material 230 and including internal reinforcement pillars 223 having a configuration similar to the reinforcement pillars 222 arranged in the cavity 235.

Thus, a method for manufacturing a detection device 1 according to this alternative of the invention differs from a method for manufacturing a detection device 1 according to the first embodiment in that during the sub-step of formation of the sub-walls 221 inner reinforcement pillars 223 are also formed between two sub-walls 221.

Obviously, the configurations of the annular side wall 220 described within the scope of the first embodiment and the alternative above are only given by way of example and are in no way limiting. Thus, it may perfectly be envisaged that the detection device 1 only has a single one-piece annular side wall 220 or instead three annular side walls 220 of which two are separated by inner reinforcement pillars 222 similar to those described within the scope of the above alternative, without going beyond the scope of the invention.

According to an alternative of the invention, not illustrated, the annular side wall 220 may comprise at least one discontinuous sub-wall, the discontinuities being filled with reinforcement material and dimensioned so as to limit the attack of the reinforcement material found at the level of these discontinuities. Obviously, according to this alternative, it may also be envisaged that the annular side wall comprises two discontinuous sub-walls, or more, the reinforcement material being arranged both in the space formed between the two sub-walls and at the level of the discontinuities.

Obviously, although in the embodiments described above the annular side walls 220 form with the cap 210 a cavity housing the set of detection structures 10, it may also be envisaged, without going beyond the scope of the invention, that these same walls form an individual cavity housing a single detection structure or a partially shared cavity housing a single part of the detection structures 100. According to these two possibilities, it is then necessary to provide other annular side walls 220 in order to form with the cap 210 the other cavity or cavities housing the remainder of the detection structures 100.

The invention claimed is:

1. A method for manufacturing a device for detecting electromagnetic radiation, the method including the following steps:
   supplying a first substrate, the first substrate integrating a reading circuit and comprising a first surface and a second surface, the first substrate further including at least two first contact plugs connected to the reading circuit and at least one first annular bonding element surrounding the first contact plugs, the first contact plugs and the first annular bonding element each being at least in part exposed on the first surface of the first substrate,
   supplying a second substrate, the second substrate including:
      a first surface of the second substrate and a second surface of the second substrate,
      at least one detection structure, for the detection of electromagnetic radiation, provided with at least two connecting arms each extending by a second contact plug complementary to one corresponding first contact plug,
      a sacrificial material enclosing the detection structure, the first connecting arm and the second connecting arm,
      a cap including the first surface of the second substrate,
      at least one annular side wall extending from the cap, the annular side wall forming with the cap a cavity housing the detection structure and the sacrificial material, the annular side wall being provided, on one end opposite to the cap, with a second annular bonding element complementary to the first annular bonding element,
   wherein the second contact plugs and the second annular bonding element are each at least in part exposed on the second surface of the second substrate,
   bonding the second surface of the second substrate on the first surface of the first substrate by bonding the second annular bonding element on the first annular bonding element and bonding the first contact plugs on the second contact plugs,
   arranging at least one opening in the second substrate, selective elimination of the sacrificial material, closing said opening under at least a primary vacuum whereby the device for detecting electromagnetic radiation is formed.

2. The method according to claim 1 further comprising a step of thinning the cap.

3. The method according to claim 1 wherein the annular side wall comprises at least one sub-wall made of a material selected from copper, silicon and tungsten.

4. The method according to claim 1, wherein the annular side wall comprises at least one barrier layer adapted to contain the diffusion of a part of at least one material constituting the annular side wall.

5. The method according to claim 4, wherein the barrier layer is made of a material selected from titanium nitride, an alloy of titanium tungsten and tantalum nitride.

6. The method according to claim 1, wherein during the step of supplying the first substrate, at least two first annular bonding elements according to a nested configuration are provided, wherein during the step of supplying the second substrate, the annular side wall includes at least two sub-walls according to a nested configuration each corresponding to a respective first annular bonding element, each of the sub-walls comprising a second annular bonding element corresponding to said sub-wall, and wherein, during the step of bonding the second surface of the second substrate on the first surface of the first substrate, each of the second annular bonding elements is bonded on the corresponding first annular bonding element.

7. The method according to claim 6, wherein during the supply of the second substrate, the cap further comprises a reinforcement material in a space between the sub-walls.

8. The method according to claim 1, wherein the second substrate (200) further comprises a base, said base comprising the second surface of the substrate and being arranged to close the cavity formed by the cap and the at least one annular side wall, wherein the second contact plugs and the second annular bonding element are each at least in part included in the base.

9. The method according to claim 1, wherein during the steps of supplying the first and the second substrate at least one of the first and the second substrates comprises at least one layer of getter with an adapted layout so that after bonding the second substrate on the first substrate and the selective elimination of the sacrificial material, said layer of getter communicates with the cavity.

10. The method according to claim 1, wherein during the step of supplying the second substrate, the detection structure is a MOS-FET transistor.

11. The method according to claim 10, wherein the step of supplying the second substrate comprises the following sub-steps:

supplying a substrate of the semiconductor layer on isolator type, the substrate of the semiconductor layer on insulator type including a support, an insulator layer formed of a sacrificial material and a semiconductor layer, selective elimination of a part of the semiconductor layer in order to delimit a portion of layer corresponding to the surface of the MOS-FET transistor, localised implantation of a doping element of a first type of conductivity in the portion of semiconductor layers, of a first and a second semiconductor zone, the first and second semiconductor zones being separated from each other by a third semiconductor zone, non-implanted, localised deposition of an insulator layer covering at least the third semiconductor zone, localised deposition of an absorption layer in contact with the insulator layer with a layout making the absorption layer able to polarise the third semiconductor zone, deposition of a protective layer covering the absorption layer and the exposed parts of the insulator layer, deposition of a first layer of sacrificial material, the first layer of sacrificial material enclosing the semiconductor layer, the insulator layer, the absorption layer and the protective layer, formation of the first and the second connecting arms comprising respectively the first and the second conduction tracks to enable the polarisation of the transistor, the first connection track being connected to the second semiconductor zone, the second connection track being connected to the first semiconductor zone and to the absorption layer by placing them in short-circuit.

deposition of a second layer of sacrificial material, the second layer of sacrificial material enclosing the first and the second connecting arms, formation of the annular side wall through the layer of dielectric material and the first and second layers of sacrificial material, the annular side wall being in contact with the support so as to form with the support a cavity, formation of the second annular bonding element and the second contact plugs so as to form the second substrate with the second contact plugs and the second annular bonding element at least in part exposed on the second surface of the second substrate.

12. The method according to claim 11, wherein during the sub-step of supplying a substrate of the semiconductor layer on insulator type of the step of supplying the second substrate, the support includes an optical treatment.

13. A device for detecting electromagnetic radiation including:

a first substrate, the first substrate integrating a reading circuit and comprising a first surface and a second surface, the first substrate further including at least two first contact plugs connected to the reading circuit and at least one first annular bonding element surrounding the first contact plugs, the first contact plugs and the first annular bonding element each being at least in part exposed on the first surface of the first substrate, at least one detection structure, for the detection of electromagnetic radiation, provided with at least two connecting arms each extending by a second contact plug complementary to a corresponding first contact plug, each of the second contact plugs being bonded to the corresponding first contact plug, a cap, at least one annular side wall extending from the cap and forming with the cap a cavity housing the detection structure, the annular side wall being provided, on one end opposite to the cap, with a second annular bonding element complementary to the first annular bonding element, the second annular bonding element being bonded to the first annular bonding element with the first substrate, the cap and the annular side wall contributing to the formation of a closed cavity having at least a primary vacuum, the at least one detection structure, the cap, the annular side wall being included into a second substrate, the second substrate comprising first surface of the second substrate and a second surface of the second substrate, wherein the second contact plugs and the second annular bonding element are each at least in part exposed on the second surface of the second substrate, and wherein the second surface of the second substrate being bonded on the first surface of the first substrate.

14. The detection device according to claim 13, wherein the cap has a thickness comprised between 1 μm and 100 μm.

15. The detection device according to claim 13, wherein the annular side wall comprises at least two sub-walls according to a nested configuration.

16. The detection device according to claim 13, wherein the detection structure is a MOS-FET transistor.

* * * * *